United States Patent
Kameshima et al.

[11] Patent Number: 6,046,446
[45] Date of Patent: Apr. 4, 2000

[54] PHOTOELECTRIC CONVERSION APPARATUS HAVING SEMICONDUCTOR STRUCTURE AND REFRESH FEATURE, AND METHOD FOR DRIVING SAME

[75] Inventors: Toshio Kameshima, Sagamihara; Yutaka Endo, Utsunomiya; Noriyuki Kaifu, Hachioji; Isao Kobayashi, Atsugi; Hideki Nonaka; Takashi Ogura, both of Utsunomiya, all of Japan

[73] Assignee: Canon Kabushiki Kaisha, Tokyo, Japan

[21] Appl. No.: 08/995,198

[22] Filed: Dec. 19, 1997

[30] Foreign Application Priority Data

Dec. 24, 1996 [JP] Japan ..... 8-343144

[51] Int. Cl.[7] ..... H01J 40/14
[52] U.S. Cl. ..... 250/214.1; 250/214 R; 257/292
[58] Field of Search ..... 250/214.1, 214 R, 250/214 LS, 214 SW, 370.08, 370.14, 208.1; 257/16, 17, 21, 53, 290, 291, 292, 448

[56] References Cited

U.S. PATENT DOCUMENTS 5,363,216  11/1994  Kim ..... 358/482
5,517,031  5/1996  Wei et al. ..... 250/370.08
5,591,963  1/1997  Takeda et al. ..... 250/214.1

FOREIGN PATENT DOCUMENTS

660421A2  6/1995  European Pat. Off. .

*Primary Examiner*—Que T. Le
*Assistant Examiner*—Kevin Pyo
*Attorney, Agent, or Firm*—Fitzpatrick, Cella, Harper & Scinto

[57] ABSTRACT

A high S/N ratio, stable, and high read rate photoelectric conversion device is formed by the same process as that for a TFT in a photoelectric conversion apparatus, and includes a photoelectric conversion device having a first electrode layer, a semiconductor layer, and a second electrode layer, first and second switch devices each having first and second main electrodes, first and second power sources, and a reading circuit, where the first electrode layer is electrically connected to the first main electrode, the second electrode layer is electrically connected to a power source, and the second main electrode is electrically connected to the reading circuit. The switch device is turned on in refresh driving for applying an electric field from the power source to the second electrode layer in a direction for guiding carriers from the semiconductor layer to the second electrode layer, thereby fixing a potential on a first electrode layer side of the photoelectric conversion device.

18 Claims, 7 Drawing Sheets

PIN TYPE PHOTODIODE
LAYER STRUCTURE (1) SENSOR REFRESH
(2) STORAGE
(3) READ(CHARGE TRANSFER)

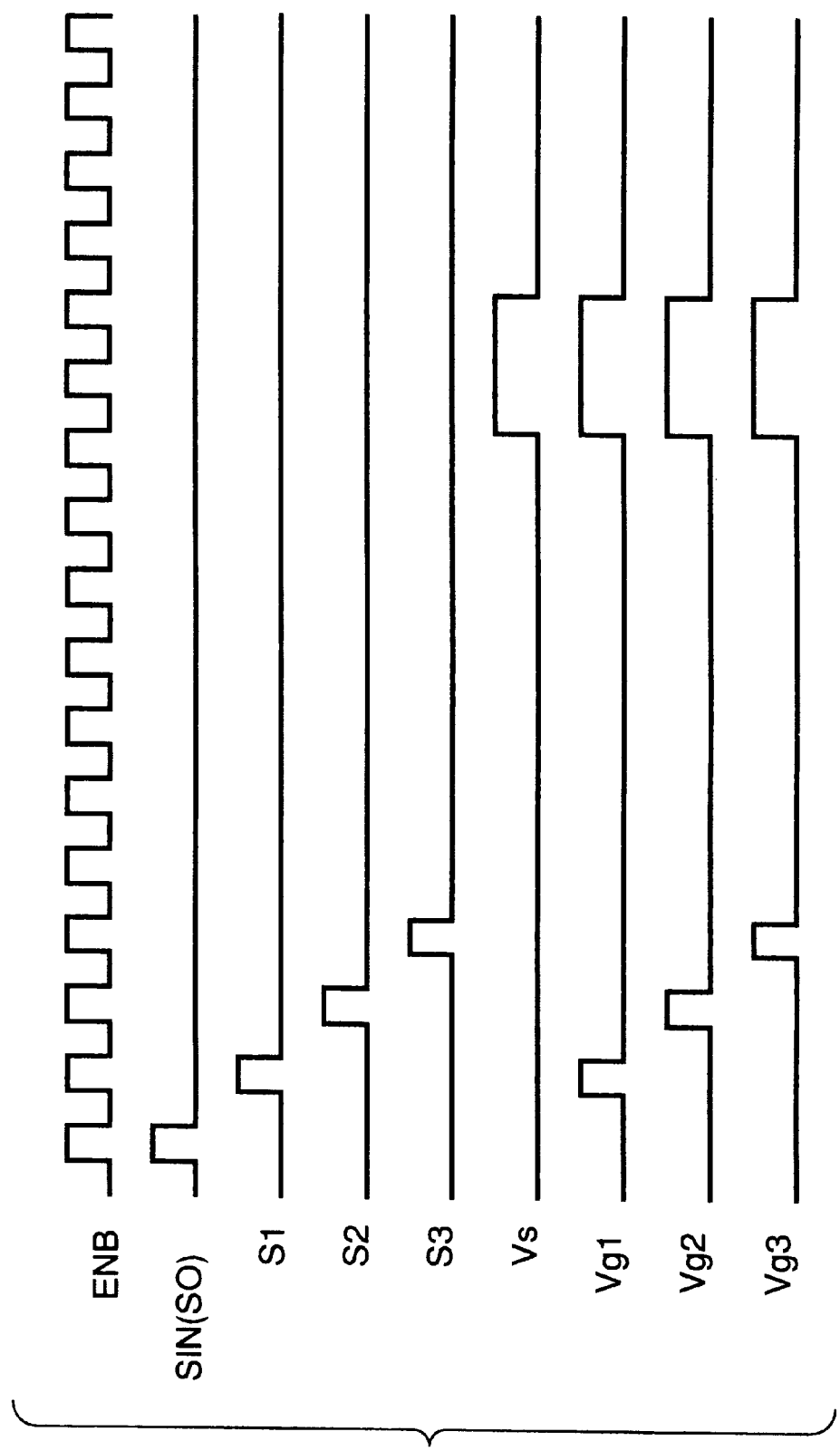

PHOTOELECTRIC CONVERSION APPARATUS HAVING SEMICONDUCTOR STRUCTURE AND REFRESH FEATURE, AND METHOD FOR DRIVING SAME

BACKGROUND OF THE INVENTION

1. Field of the Invention

The present invention relates to a photoelectric conversion apparatus and a method of driving the same and, more particularly, to a photoelectric conversion apparatus used as an image input means for, e.g., a scanner or an X-ray image pickup apparatus. The photoelectric conversion apparatus is formed by one- or two-dimensionally arraying a plurality of pixels each having a photoelectric conversion device and a switch device. The invention also relates to a method of driving the apparatus.

2. Related Background Art

In recent years, a reading system for a scanner, a digital copying machine, or an X-ray image pickup apparatus has been developed using, a one- or two-dimensional sensor which reads an image with a structure in which photoelectric conversion devices consisting of a semiconductor material represented by amorphous silicon hydride (a-Si) enabling thin film formation and signal processing units are formed on a large-area substrate. Especially, a-Si or polysilicon (poly-Si) can be used not only as a photoelectric conversion material but also as a semiconductor material of a thin film field effect transistor (TFT), so a photoelectric conversion semiconductor layer and a TFT semiconductor layer can be simultaneously formed.

In addition, in a photoelectric conversion apparatus, a capacitor is connected to a signal output line, or a signal output line is provided with a capacitor, and the capacitor is initialized (refreshed).

The photoelectric conversion device also has a capacitor component, and charges stored in the photoelectric conversion device are initialized (refreshed) to prevent an adverse effect on the next signal read.

However, when the voltage of only one electrode of the photoelectric conversion device is controlled using, e.g., a switch, initialization (refresh) can be performed although a time is required for this operation. For this reason, such an arrangement cannot sufficiently meet a requirement for a high-speed operation.

SUMMARY OF THE INVENTION

The present invention has been made in consideration of the above situation, and has as its object to provide a photoelectric conversion apparatus capable of performing a high-speed read operation and a method of driving the same.

It is another object of the present invention to provide a photoelectric conversion apparatus capable of outputting a signal having a higher S/N ratio and a method of driving the same.

It is still another object of the present invention to provide a photoelectric conversion apparatus having stable read characteristics and a method of driving the same.

It is still another object of the present invention to provide a photoelectric conversion apparatus comprising a photoelectric conversion device having a first electrode layer, a second electrode layer, and a semiconductor layer between the first and second electrode layers, a switch device having first and second main electrodes, a power source, a reading circuit, the first electrode layer being electrically connected to the first main electrode, the second electrode layer being electrically connected to the power source, and the second main electrode being electrically connected to the reading circuit, and means for turning on the switch device in refresh driving for applying an electric field from the power source to the second electrode layer in a direction for guiding carriers to the second electrode layer, thereby fixing a potential on the first electrode layer side.

It is still another object of the present invention to provide a method of driving a photoelectric conversion apparatus comprising a photoelectric conversion device having a first electrode layer, a second electrode layer, and a semiconductor layer between the first and second electrode layers, a switch device having a first main electrode connected to the first electrode layer, and a second main electrode connected to a reading circuit, and a power source connected to the second electrode layer, comprising the step of applying a voltage to the second electrode layer to turn on the switch device and simultaneously refresh the photoelectric conversion device, thereby refreshing the photoelectric conversion device.

According to the present invention for achieving these objects, the driving system circuit of a photoelectric conversion apparatus in which photoelectric conversion devices and TFTs are simultaneously formed can be simplified, and when a large number of pixels are arrayed, the read rate can be increased. In addition, since the photoelectric conversion device can also be initialized, a more stable and accurate read can be realized.

In the apparatus, preferably, the photoelectric conversion device has, between the first electrode layer and the semiconductor layer, an insulating layer for inhibiting passage of first and second carriers having negative and positive polarities, respectively, and between the semiconductor layer and the second electrode layer, a carrier injection inhibiting layer for preventing the first carriers from being injected into the semiconductor layer.

Preferably, the switch device comprises a thin film transistor having a gate electrode for controlling electrical connection between the first and second main electrodes, an insulating layer, a semiconductor layer, and source and drain electrodes serving as the first and second main electrodes having a gap therebetween and formed on the semiconductor layer via an ohmic contact layer.

Preferably, the photoelectric conversion device has, between the first electrode layer and the semiconductor layer, an insulating layer for inhibiting passage of first and second carriers having negative and positive polarities, respectively, and between the semiconductor layer and the second electrode layer, a carrier injection inhibiting layer for preventing the first carriers from being injected into the semiconductor layer, and the switch device comprises a thin film transistor having a gate electrode for controlling electrical connection between the first and second main electrodes, an insulating layer, a semiconductor layer, and source and drain electrodes serving as the first and second main electrodes having a gap therebetween and formed on the semiconductor layer via an ohmic contact layer.

Preferably, the first electrode layer of the photoelectric conversion device and the gate electrode of the thin film transistor, the insulating layer of the photoelectric conversion device and the insulating layer of the thin film transistor, the semiconductor layer of the photoelectric conversion device and the semiconductor layer of the thin film transistor, the first carrier injection inhibiting layer of the photoelectric conversion device and the ohmic contact layer of the thin film transistor, and the second electrode layer of the photoelectric conversion device and the source and drain electrodes of the thin film transistor are respectively formed from the same materials. In this case, since layers of the same material can be simultaneously formed, the manufacture thereof is facilitated.

As the semiconductor layer, amorphous silicon hydride or polysilicon can be used.

Preferably, the injection inhibiting layer comprises a semiconductor layer doped with an n- or p-type element.

The reading circuit may have a capacitor device and a second switch device, one terminal of the capacitor device may be connected to the second main electrode of the switch device of the photoelectric conversion apparatus, one terminal of the second switch device may be connected to the second main electrode of the switch device of the photoelectric conversion apparatus, and the other terminal of the second switch device may be connected to the second power source.

The apparatus may further comprise means for turning on the second switch device in refresh driving, thereby fixing the potential on the first electrode layer side of the photoelectric conversion device.

A plurality of pixels each having the first electrode layer of the photoelectric conversion device connected to a source or drain electrode of a thin film transistor may be arrayed, and the means for fixing the potential may have a shift register for receiving a start pulse and a clock pulse and sequentially outputting shift pulses synchronized with the clock pulse and a logical operation device, and input a refresh driving pulse for refresh driving and the shift pulse output from the shift register to the logical operation device to generate a signal for applying, to a gate electrode of the thin film transistor of each pixel, a gate driving pulse obtained by logically calculating the refresh driving pulse and the shift pulse.

The logical operation device may be constituted using a thin film transistor.

The shift resister may be constituted using a thin film transistor.

In the above method, preferably, application of the voltage for refreshing the photoelectric conversion device includes applying an electric field in a direction for guiding charges stored in the photoelectric conversion device to the second electrode layer.

BRIEF DESCRIPTION OF THE DRAWINGS

FIG. 9 is a timing chart of the circuit shown FIG. 8.

DESCRIPTION OF THE PREFERRED EMBODIMENTS

An example of a photoelectric conversion device which can be applied to the present invention described below.

Figure 1:
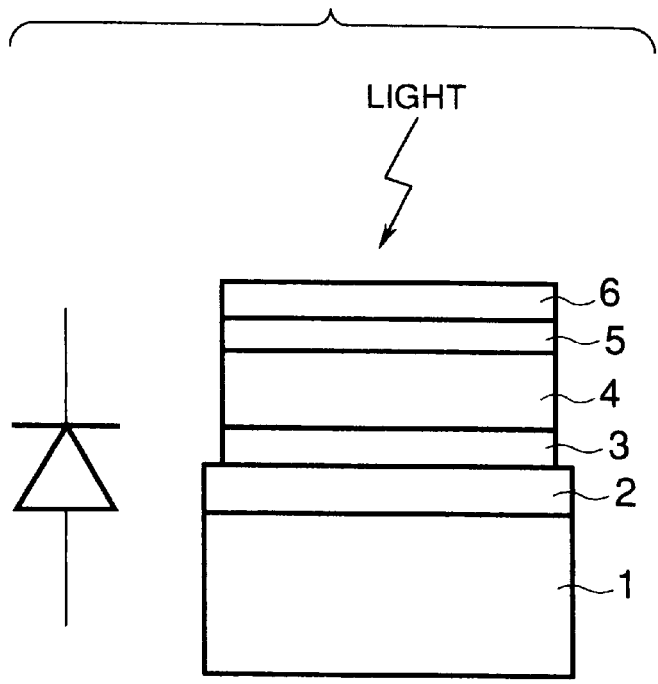
FIG. 1 is a schematic sectional view showing an example of a photoelectric conversion device.
Figure 2:
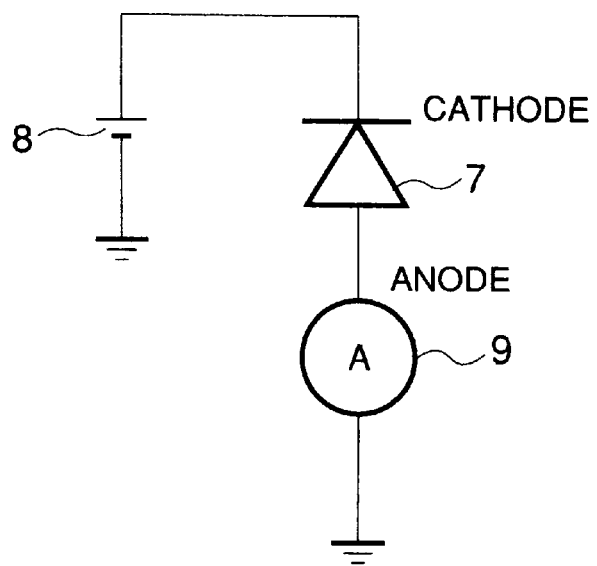
FIG. 2 is a schematic circuit diagram showing an example of the basic driving circuit of the photoelectric conversion device.

FIG. 1 is a schematic sectional view for explaining an example of the layer structure of a photoelectric conversion device which can be used for a photoelectric conversion apparatus. FIG. 2 is a schematic circuit diagram showing an example of a driving circuit which can be applied to the photoelectric conversion device.

FIG. 1 shows the layer structure of a pin type photodiode. In FIG. 1, the pin type photodiode has an insulating substrate 1, a lower electrode 2, a p-type semiconductor layer 3 (to be referred to as a p-layer hereinafter), an intrinsic semiconductor layer 4 (to be referred to as an i-layer hereinafter), a n-type semiconductor layer 5 (to be referred to as an n-layer hereinafter), and a transparent electrode 6 made of, e.g., ITO. FIG. 2 shows a circuit for biasing the power source and measuring the supplied current in the photoelectric conversion device (i.e., for driving the photoelectric conversion device). Referring to FIG. 2, the circuit comprises a photoelectric conversion device 7 as a pin type photodiode, a power source 8, and a detection unit 9 such as a current amplifier. The cathode of the photodiode 7 shown in FIG. 2 corresponds to the side of the transparent electrode 6 shown in FIG. 1, and the anode of the photodiode 7 corresponds to the side of the lower electrode 2 shown in FIG. 1. The power source 8 is set such that a positive voltage is applied to the cathode side with respect to the anode side.

As shown in FIG. 1, when external light is incident and absorbed by the i-layer 4 through the n-layer, electrons and holes are generated. An electric field is applied to the i-layer 4 by the power source 8. For this reason, the electrons move to the cathode side, i.e., the transparent electrode 6 side through the n-layer 5 while the holes move to the anode side, i.e., the lower electrode 2 side. At this time, a photocurrent flows through the photosensor. When no external light is incident, neither electrons nor holes are generated. Since the n-layer 5 acts as an injection inhibiting layer for holes in the transparent electrode 6, and the p-layer 3 acts as an injection inhibiting layer for electrons in the lower electrode 2, no photocurrent flows. The photocurrent changes depending on the presence/absence of external light. When this change is detected by the detection unit 9, so the photodiode operates as a photosensor whose current value changes in accordance with the light amount.

However, such a photosensor may have the following problems.

(1) Since two injection inhibiting layers must be formed, film formation conditions for each layer can hardly be optimized and, more particularly, each layer interface is difficult to control. Defects in the layer may generate a dark current, so a desired sensor having a high S/N ratio cannot be realized.

(2) Assume that the photodiode is to be formed on the same substrate as that of a TFT having a function of, e.g., transferring photoelectrically converted charges. The photoelectric conversion device shown in FIG. 1 has a layer structure comprising a transparent electrode, a p-layer, an i-layer, an n-layer, and an electrode from the side of light incidence. However, the TFT has a different layer structure comprising, e.g., an electrode, an insulating film, an i-layer, an n-layer, and an electrode when viewed from the same direction as described above. Therefore, layers of these devices cannot be simultaneously formed by the same process. The manufacturing process may inevitably become complex, resulting in disadvantages in cost and yield.

In consideration of these points, an arrangement example of the pixel portion of a photoelectric conversion apparatus whose photoelectric conversion device has the same layer structure as that of the TFT will be described with reference to the schematic sectional view shown in FIG. 3.

Figure 3:
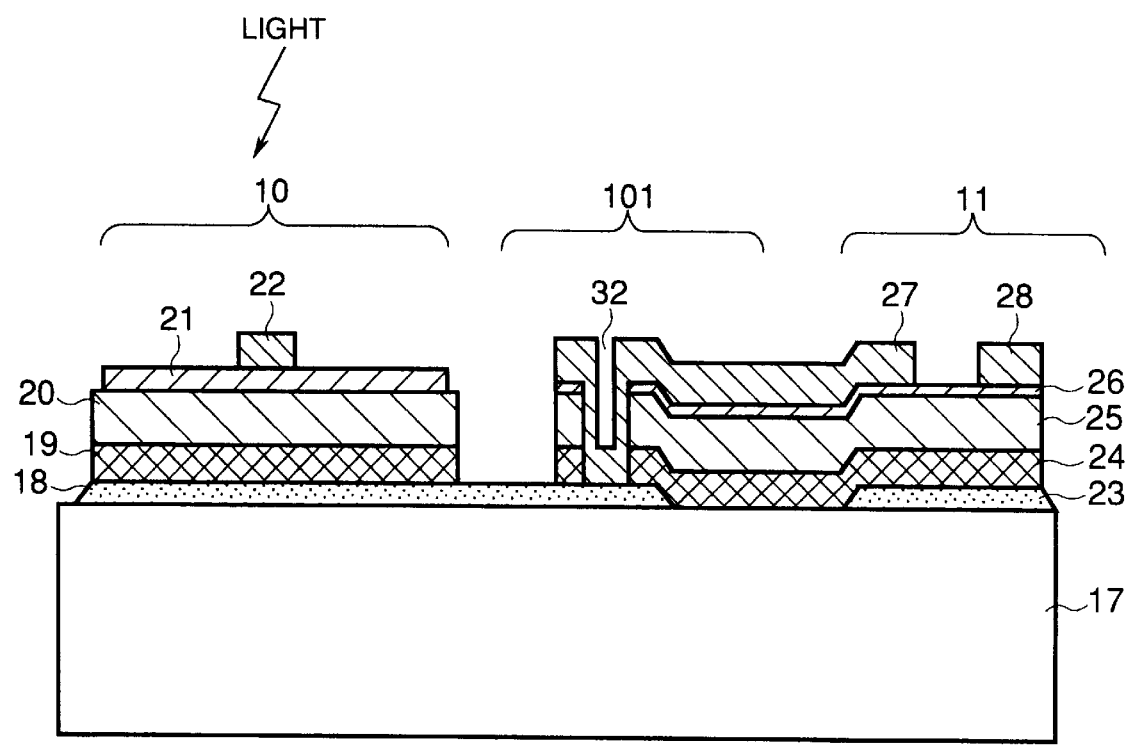
FIG. 3 is a schematic sectional view showing an example of the photoelectric conversion unit of a photoelectric conversion apparatus.

FIG. 3 shows the sections of a photoelectric conversion device 10, a TFT 11, and a connection portion (contact hole) 101. In FIG. 3, an insulating substrate 17 consists of, e.g., glass. A lower electrode 18 of the photoelectric conversion device 10 is formed by depositing aluminum or chromium on the insulating substrate 17 by, e.g., vacuum deposition. An insulating layer 19 consisting of silicon nitride or silicon oxide is formed on the lower electrode 18 to prevent passage of both electrons and holes. A semiconductor layer 20 consisting of an intrinsic semiconductor such as amorphous silicon hydride is formed on the insulating layer 19. An injection inhibiting layer 21 as an $n^+$-type amorphous silicon layer is formed to prevent injection of holes from an electrode 22 side to the semiconductor layer 20. The upper electrode 22 is made of aluminum or ITO.

Referring to FIG. 3, a gate electrode 23 of the TFT is formed on the insulating substrate 17. An insulating layer 24 is formed on the gate electrode 23. A semiconductor layer 25 is formed on the insulating layer 24. An $n^+$-type layer 26 is formed to obtain ohmic contact with the $n^+$-type layer 26. Source and drain electrodes 27 and 28 are formed on the $n^+$-type layer 26. The source electrode 27 of the TFT 11 is connected to the lower electrode 18 of the photoelectric conversion device 10 through a contact hole 32 of a connection portion 101.

A method of manufacturing the photoelectric conversion apparatus shown in FIG. 3 will be described next. The photoelectric conversion apparatus is manufactured by simultaneously forming the photoelectric conversion device 10, the connection portion, and the TFT device 11. First, the lower electrode 18 of the photoelectric conversion device 10 and the gate electrode 23, which consist of aluminum or chromium, are formed on the insulating substrate 17. Patterning is sequentially performed to form the insulating layers 19 and 24 of silicon nitride or silicon oxide, the semiconductor layers 20 and 25 of an intrinsic semiconductor such as amorphous silicon hydride, and the injection inhibiting layers 21 and 26 as $n^+$-layers of amorphous silicon hydride. An external circuit contact portion including the contact hole 32 of the connection portion and a portion adjacent to the photoelectric conversion device 10 are removed by etching. Patterning is performed to form the upper electrode 22, the source electrode 27, and the drain electrode 28. A connection line is fused to the external circuit connection portion, thereby completing the photoelectric conversion apparatus. Although, in this example, the injection inhibiting layer is formed as an $n^+$-layer, it may be a $p^+$-layer. That is, the injection inhibiting layer may be a semiconductor layer containing boron or phosphorus. In this manner, the photoelectric conversion device 10, the connection portion, and the TFT device 11 can be simultaneously formed by applying a so-called MOS process to most steps.

A preferred example of photoelectric conversion using a set of the photoelectric conversion device and the TFT shown in FIG. 3 will be described.

Figure 4:
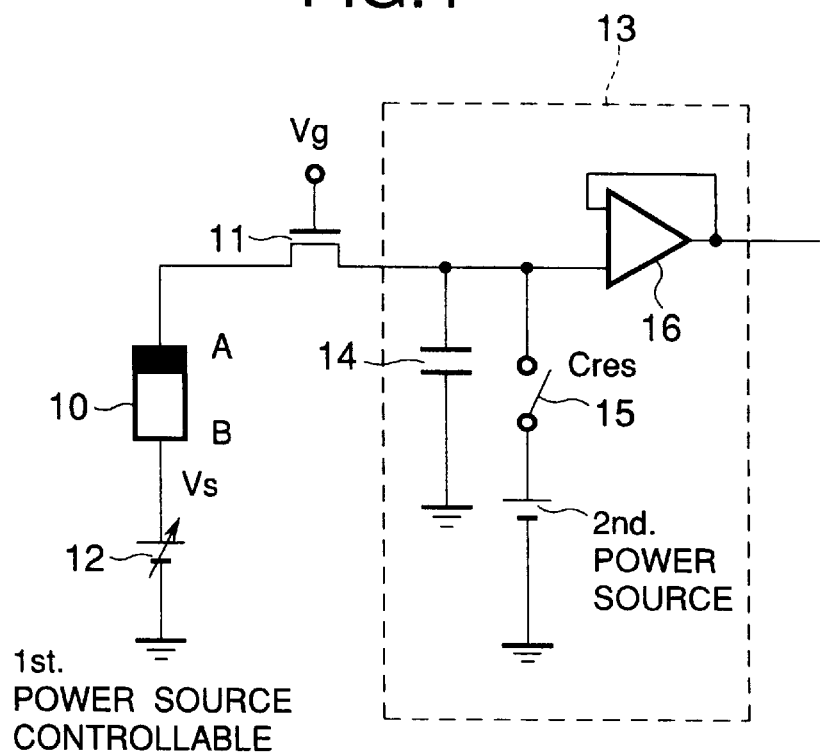
FIG. 4 is a schematic circuit diagram of the photoelectric conversion apparatus shown in FIG. 3.
Figure 5:
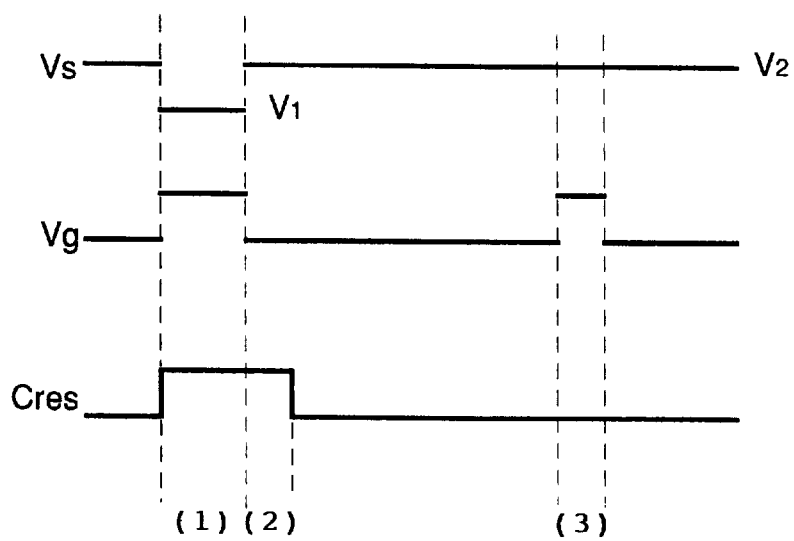
FIG. 5 is a timing chart of the circuit shown in FIG. 4.

FIG. 4 is a schematic circuit diagram for explaining a photoelectric conversion apparatus according to the first embodiment of the present invention. FIG. 5 is a drive timing chart of the photoelectric conversion apparatus of the present invention.

Referring to FIG. 4, the photoelectric conversion apparatus comprises the photoelectric conversion device 10, the switch device 11, a power source 12 which can be controlled, and a reading circuit 13. In FIG. 4, the switch device 11 is constituted by a thin film transistor (TFT), and the reading circuit 13 is constituted by a capacitor device 14, a switch device 15, and an amplifier 16.

For the photoelectric conversion device 10, reference symbol A corresponds to the lower electrode 18 side; and B, the upper electrode 22 side. In the read operation of the photoelectric conversion device 10 having the structure shown in FIG. 3, a positive potential is applied to the upper electrode 22 with respect to the lower electrode 18. Electrons and holes, which are generated by light absorbed by the semiconductor layer 20, are guided to the upper electrode 22 side and the drain electrode 28 side, respectively, by the electric field to generate a photocurrent. However, the holes cannot pass through the insulating layer 19 and are stored at the interface between the semiconductor layer 20 and the insulating layer 19. For this reason, the photoelectric conversion device 10 of the present invention requires refresh driving to apply an electric field in a direction for guiding the holes stored in the semiconductor layer 20 to the upper electrode 22 side (i.e., in refreshing, a potential V1 of the upper electrode 22 is lowered relative to a potential V2 in the read [V1<V2], as shown in FIG. 5). A refresh pulse is applied to the upper electrode 22 shown in FIG. 3.

FIG. 5 is a drive timing chart of the photoelectric conversion apparatus of the present invention. In FIG. 5, Vs represents a voltage waveform applied to the upper electrode 22 side of the photoelectric conversion device 10; Vg, a voltage waveform applied to the gate electrode of the TFT 11; and Cres, a waveform (in this case, ON when the voltage goes "H") applied to the capacitor reset switch 15.

The photoelectric conversion apparatus of the present invention has three operations, as will be described below.

(a) Refresh Operation ((1) in FIG. 5)

The voltage Vs of the power source 12 is set at V1 to turn on the TFT 11 and the switch device 15, thereby refreshing first carriers stored in the photoelectric conversion device 10.

(b) Storage Operation ((2) in FIG. 5)

After the refresh operation (a), the voltage Vs of the power source 12 is set at V2 to turn off the TFT 11, thereby starting the storage operation. During this time, charges corresponding to the incident light amount are stored in the photoelectric conversion device 10. In FIG. 5, when a predetermined time has elapsed from the refresh operation, the voltage Cres goes "L", i.e., the switch 15 is turned off. However, the switch 15 may be turned off simultaneously with the end of the refresh operation.

(c) Transfer Operation (Read (3) in FIG. 5)

Finally, the TFT 11 is turned on to transfer charges stored in the photoelectric conversion device 10 to the charge storage capacitor 14 so the charges are read by the reading amplifier 16.

In the circuit arrangement shown in FIG. 4, in refresh driving, it is necessary not only to turn on the TFT 11 it is necessary to simultaneously turn on the capacitor reset switch 15 of the reading circuit 13, to fix the voltage of the lower electrode 18 of the photoelectric conversion device 10. More specifically, when the potential of the lower electrode 18, i.e., the first electrode of the photoelectric conversion device is fixed, the photoelectric conversion device 10 can be refreshed, and the external light amount can be newly detected and read.

Figure 6:
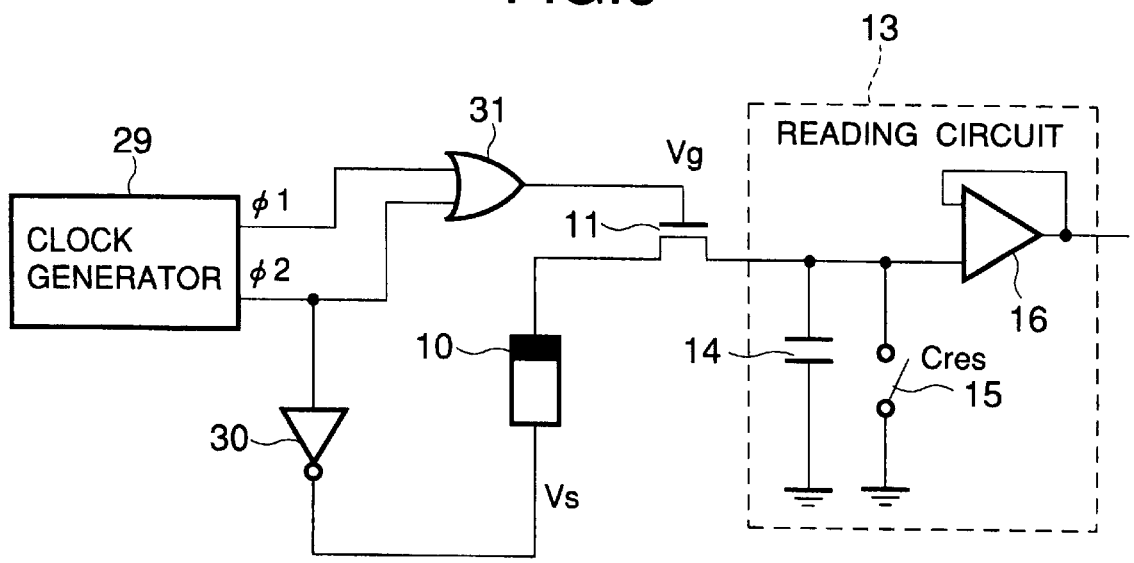
FIG. 6 is a schematic circuit diagram showing a more specific arrangement of the circuit shown in FIG. 4.

FIG. 6 is a circuit diagram showing a specific arrangement for simultaneously performing refresh driving and the ON operation of the TFT 11 in the photoelectric conversion apparatus of the present invention. Referring to FIG. 6, a clock pulse generator 29 supplies a clock pulse signal to the photoelectric conversion apparatus at a desired timing. A buffer 30 converts the signal from the clock pulse generator 29 into an appropriate voltage to enable power supply. This circuit also includes a logical operation device (in this case, an adder) 31. The same reference numerals as in FIG. 4 denote the same parts in FIG. 6.

Figure 7:
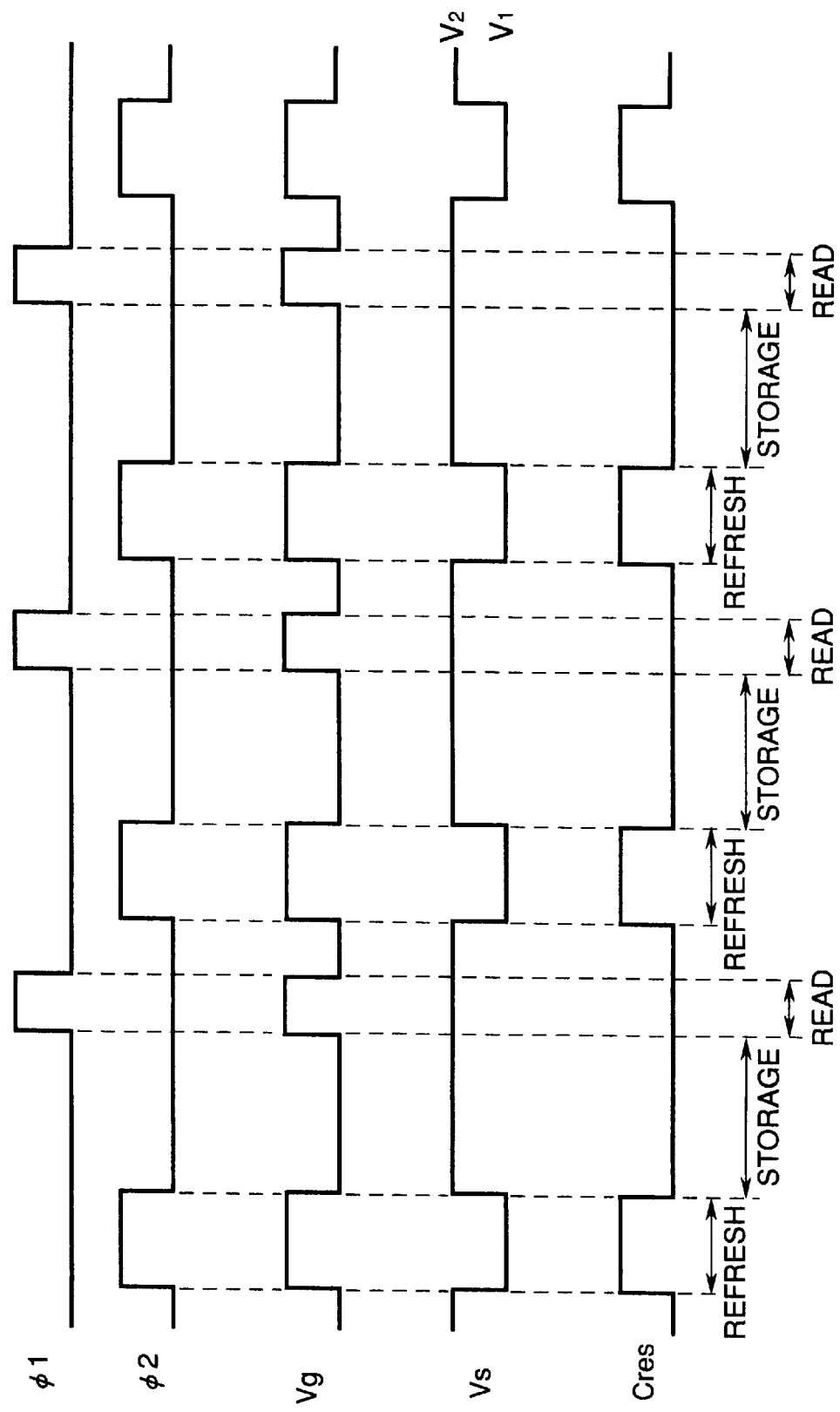
FIG. 7 is a timing chart of the circuit shown in FIG. 6.

FIG. 7 is a drive timing chart of the circuit shown in FIG. 6. Timing signals φ1 and φ2 shown in FIG. 7 are output from the clock pulse generator 29 shown in FIG. 6. Only when both the timing signals φ1 and φ2 are at low level, the voltage Vg is also at low level, so the TFT 11 is OFF. The signal Vs which is obtained by inverting the signal φ2 and converting it into an appropriate voltage (V1 and V2 in FIG. 7) by the buffer 30 is supplied to the photoelectric conversion device 10.

The refresh operation is started first. The timing signal φ1 from the clock generator 29 goes "L", and the timing signal φ2 goes "H". A high pulse is output from the logical operation device 31 to turn on the TFT 11. Simultaneously, the output from the buffer 30 is set at V1. The capacitor reset pulse Cres is applied from a clock circuit (not shown) to the switch device 15, so the switch device 15 is turned on. When the voltage Vs to be applied to the photoelectric conversion device 10 is set at VI while the TFT 11 and the switch device 15 are ON, the first carriers (holes in this description) stored in the photoelectric conversion device 10 are removed, i.e., refreshed. The potential of the capacitor 14 is also reset to the potential of the second power source.

Next, the timing signals φ1 and φ2 are set at "L"(in this description, the capacitor reset pulse Cres is also simultaneously set at "L") to turn on the TFT 11 and the switch device 15. The bias voltage Vs=V2 is applied to the photoelectric conversion device 10 to store charges corresponding to the external light amount in a predetermined time.

Subsequently, the timing signal φ1 goes to "H", and the timing signal φ2 goes "L". The TFT 11 is turned on, so the charges stored in the photoelectric conversion device 10 are transferred to the capacitor 14, and the potential of the capacitor 14 is output from the amplifier 16. When the cycle of refresh → storage → read of the photoelectric conversion device is repeated with this simple circuit arrangement, the external light amount can be read.

When refresh driving and the ON operation of the TFT are simultaneously performed, a read can be accurately performed at a high speed.

Another embodiment of the present invention will be described below.

Figure 8:
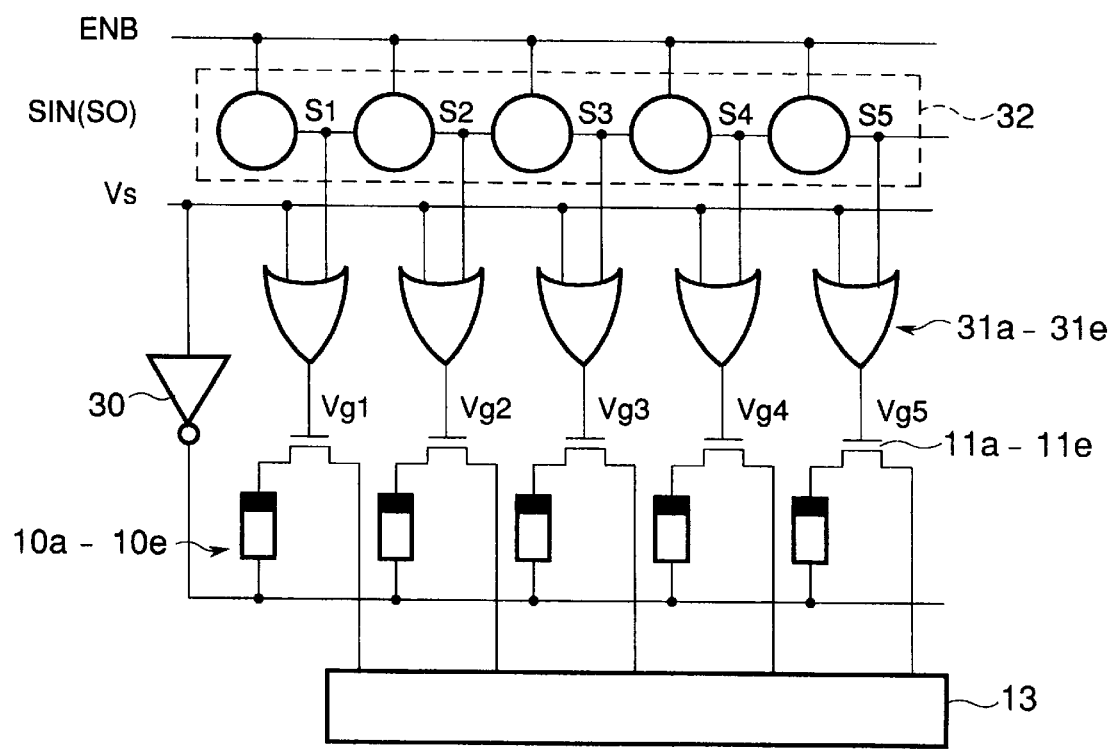
FIG. 8 is a schematic circuit diagram of a photoelectric conversion apparatus of another embodiment.

FIG. 8 is a schematic circuit diagram for explaining a photoelectric conversion apparatus of another embodiment of the present invention. FIG. 9 is a drive timing chart of the photoelectric conversion apparatus. Referring to FIG. 8, the photoelectric conversion apparatus comprises a shift register 32 for receiving a start pulse SIN and a clock pulse ENB and sequentially outputting shift pulses S1 to S5 synchronized with the clock pulse ENB, logical operation devices 31a to 31e, photoelectric conversion devices 10a to 10e, TFTs 11a to 11e, a buffer 30 for converting a pulse (refresh pulse) Vs for controlling the voltage to be applied to an upper electrode 22 of each of the photoelectric conversion devices 10a to 10e into an appropriate voltage, and a reading circuit 13 including, at least between the input signal line and the reference potential, a switch device which is turned on/off in accordance with a control pulse signal. In FIG. 8, gate pulses Vg1 to Vg5 obtained upon logically calculating the shift pulses S1 to S5 from the shift register 32 and the refresh pulse Vs are applied to the gate electrodes of the TFTs 11a to 11e, respectively. FIG. 9 shows the timings of signals at various portions of the circuit shown in FIG. 8.

In the circuit arrangement shown in FIG. 8, the clock pulse ENB is supplied, and the operation starts in accordance with one start pulse SIN. The shift pulses S1 to S5 sequentially go "H". When the shift pulses S1 to S5 go "H", the gate pulses Vg1 to Vg5 go "H", accordingly. During this time, the refresh pulse Vs is at "L", and a bias voltage is being applied to the photoelectric conversion devices 10a to 10e. When the gate pulses Vg1 to Vg5 are at "H", photoelectric charges in the photoelectric conversion devices 10a to 10e are transferred to the reading circuit 13 through the TFTs 11a to 11e, respectively. The reading circuit 13 outputs the input photoelectric charges to an external circuit. When the refresh pulse Vs goes "H", the gate pulses Vg1 to Vg5 are set at "H"even when the shift pulses S1 to S5 are at "L". The TFTs 11a to 11e are simultaneously turned on, and at the same time, the switch device (not shown) in the reading circuit 13 is also turned on, so the potential on a side of each of the photoelectric conversion devices 10a to 10e, which is connected to the corresponding TFT, is fixed at the reference potential. In this state, a bias voltage is applied to the photoelectric conversion devices 10a to 10e to remove the first carriers from the buffer 30, so the photoelectric conversion devices are refreshed.

In this arrangement, the basic cycle of refresh → storage → read of the plurality of photoelectric conversion devices can be performed to directly read time-series photoelectric charges from the photoelectric conversion devices 10a to 10e. The arrangement is simple because no special means is required to read the time-series charges.

With such a circuit arrangement in which refresh driving (for guiding carriers stored at the interface between a semiconductor layer 20 and an insulating layer 19 of each of the photoelectric conversion devices 10a to 10e to the upper electrode 22) is performed simultaneously with the ON operation of the gate electrode of each of the TFTs 11a to 11e, even when the photoelectric conversion devices are one- or two-dimensionally arrayed as multiple pixels, all the pixels can be simultaneously refreshed, resulting in a large contribution to an increase in the read rate of the photoelectric conversion apparatus.

As has been described above, according to the present invention, the driving system circuit of the photoelectric conversion apparatus in which photoelectric conversion devices and TFTs are simultaneously formed can be simplified, and when a large number of pixels are arrayed, the read rate can be increased.

In addition, according to the present invention, since the photoelectric conversion device can also be initialized, a more stable and accurate read can be realized.

The present invention is not limited to the above description, and various changes and modifications can be appropriately made within the scope and spirit of the present invention, as a matter of course.

What is claimed is:

1. A photoelectric conversion apparatus comprising:
   a photoelectric conversion device having a first electrode layer, a second electrode layer, and a semiconductor layer between said first electrode layer and said second electrode layer;
   first and second switch devices each having first and second main electrodes;
   first and second power sources;

a reading circuit, said first electrode layer being electrically connected to said first main electrode of said first switch device, said second electrode layer being electrically connected to said first power source, said second main electrode of said first switch device being electrically connected to said reading circuit, said first main electrode of said second switch device being electrically connected to said second main electrode of said first switch device and to said reading circuit, and said second main electrode of said second switch device being connected to said second power source; and means for outputting a signal for refresh driving by applying an electric field in a direction for guiding carriers from said second power supply to said second electrode layer, and for simultaneously outputting a signal for turning on said first switch device, thereby fixing a potential on a first electrode layer side of said photoelectric conversion device.

2. An apparatus according to claim 1, wherein said photoelectric conversion device has, between said first electrode layer and said semiconductor layer, an insulating layer for inhibiting passage of first and second carriers having negative and positive polarities, respectively, and between said semiconductor layer and said second electrode layer, a carrier injection inhibiting layer for preventing the first carriers from being injected into said semiconductor layer.

3. An apparatus according to claim 1, wherein said first switch device comprises a thin film transistor having a gate electrode controlling electrical connection between said first and second main electrodes, an insulating layer, a semiconductor layer, and source and drain electrodes respectively constituting said first main electrode and said second main electrode, said source and drain electrodes having a gap therebetween and being formed on said semiconductor layer via an ohmic contact layer.

4. An apparatus according to claim 1, wherein said photoelectric conversion device has, between said first electrode layer and said semiconductor layer, an insulating layer for inhibiting passage of first and second carriers having negative and positive polarities, respectively, and between said semiconductor layer and said second electrode layer, a carrier injection inhibiting layer for preventing the first carriers from being injected into said semiconductor layer, and said first switch device comprises a thin film transistor having a gate electrode controlling electrical connection between said first main electrode and said second main electrode, an insulating layer, a semiconductor layer, and source and drain electrodes respectively constituting said first main electrode and said second main electrode, said source and drain electrodes having a gap therebetween and being formed on said semiconductor layer via an ohmic contact layer.

5. An apparatus according to claim 4, wherein said first electrode layer of said photoelectric conversion device and said gate electrode of said thin film transistor are formed of the same material, said insulating layer of said photoelectric conversion device and said insulating layer of said thin film transistor are formed of the same material, said semiconductor layer of said photoelectric conversion device and said semiconductor layer of said thin film transistor are formed of the same material, said first carrier injection inhibiting layer of said photoelectric conversion device and said ohmic contact layer of said thin film transistor are made of the same material, and said second electrode layer of said photoelectric conversion device and said source and drain electrodes of said thin film transistor are formed of the same material.

6. An apparatus according to claim 5, wherein said semiconductor layer essentially is made of a material selected from the group consisting of amorphous silicon hydride and polysilicon.

7. An apparatus according to claim 1, wherein said semiconductor layer essentially is made of a material selected from the group consisting of amorphous silicon hydride and polysilicon.

8. An apparatus according to claim 2, wherein said injection inhibiting layer comprises a semiconductor layer doped with an n-type or a p-type element.

9. An apparatus according to claim 5, wherein said injection inhibiting layer comprises a semiconductor layer doped with an n-type or a p-type element.

10. An apparatus according to claim 1, further comprising a capacitor device, where one terminal of said capacitor device is electrically connected between said second main electrode of said first switch device and said first main electrode of said second switch device.

11. An apparatus according to claim 1, further comprises means for turning on said second switch device in refresh driving, thereby fixing the potential on the first electrode layer side of said photoelectric conversion device.

12. An apparatus according to claim 1, wherein a plurality of pixels each having said first electrode layer of said photoelectric conversion device connected to a source or drain electrode of a thin film transistor are arrayed, and said means for fixing the potential has a shift register, for receiving a start pulse and a clock pulse and sequentially outputting shift pulses synchronized with clock pulses, and a logical operation device, and inputs a refresh driving pulse for refresh driving and the shift pulse output from said shift register to said logical operation device to generate a signal for applying, to a gate electrode of said thin film transistor of each pixel, a gate driving pulse obtained by logically calculating the refresh driving pulse and the shift pulse.

13. An apparatus according to claim 12, wherein said logical operation device comprises a thin film transistor.

14. An apparatus according to claim 12, wherein said shift register comprises a thin film transistor.

15. A method of driving a photoelectric conversion apparatus, the apparatus comprising a photoelectric conversion device having a first electrode layer, a second electrode layer, and a semiconductor layer between the first electrode layer and the second electrode layer, first and second switch devices each having first and second main electrodes, first and second power sources, and a reading circuit, where the first electrode layer is electrically connected to the first main electrode of the first switch device, the second electrode layer is electrically connected to the first power source, the second main electrode of the first switch device is connected to the reading circuit, the first main electrode of the second switch device is electrically connected to the reading circuit, and the second main electrode of the second switch is connected to the second power source, said method comprising the step of:

turning on the first and second switch devices, and applying a voltage to the second electrode layer to refresh said photoelectric conversion device.

16. A method according to claim 15, wherein application of the voltage for refreshing said photoelectric conversion device includes applying an electric field in a direction for guiding charges stored in said photoelectric conversion device to said second electrode layer.

17. An apparatus according to claim 1, wherein said second switch device comprises a thin film transistor having a gate electrode controlling electrical connection between said first and second main electrodes, an insulating layer, a semiconductor layer, and source and drain electrodes respectively constituting said first main electrode and said second main electrode, said source and drain electrodes having a gap therebetween and being formed on said semiconductor layer via an ohmic contact layer.

18. A driving method according to claim 15, wherein the turning off of said second switch device is performed after the turning off of said first switch device.

* * * * *

UNITED STATES PATENT AND TRADEMARK OFFICE
CERTIFICATE OF CORRECTION

PATENT NO. : 6,046,446
DATED : April 4, 2000
INVENTOR(S) : TOSHIO KAMESHIMA ET AL.

It is certified that error appears in the above-identified patent and that said Letters Patent is hereby corrected as shown below:

COLUMN 3

Line 37, "resister" should read --register--.

COLUMN 6

Line 55, "TFT 11" should read --TFT 11,--.

COLUMN 8

Line 65, "devices" should read --devices,--.

Signed and Sealed this

Seventeenth Day of April, 2001

Attest:

NICHOLAS P. GODICI

*Attesting Officer*　　*Acting Director of the United States Patent and Trademark Office*